United States Patent
Park et al.

(10) Patent No.: US 9,000,958 B1
(45) Date of Patent: Apr. 7, 2015

(54) DEVICE AND METHOD FOR CONVERTING DATA RATE

(71) Applicant: Electronics and Telecommunications Research Institute, Daejeon (KR)

(72) Inventors: Mi Jeong Park, Chungcheongnam-do (KR); Ik Soo Eo, Daejeon (KR); Sang-Kyun Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/206,522

(22) Filed: Mar. 12, 2014

(30) Foreign Application Priority Data

Oct. 4, 2013 (KR) .......................... 10-2013-0118713

(51) Int. Cl.
*H03M 7/00* (2006.01)

(52) U.S. Cl.
CPC ...................... *H03M 7/00* (2013.01)

(58) Field of Classification Search
USPC ................................ 341/50, 61, 63
See application file for complete search history.

(56) References Cited

U.S. PATENT DOCUMENTS

| | | | | |
|---|---|---|---|---|
| 5,666,299 A | * | 9/1997 | Adams et al. | 708/300 |
| 7,342,518 B2 | | 3/2008 | Midya et al. | |
| 7,408,485 B1 | * | 8/2008 | Yu et al. | 341/61 |
| 7,415,493 B2 | * | 8/2008 | Dahan | 708/313 |
| 8,405,532 B1 | * | 3/2013 | Clark et al. | 341/61 |
| 2013/0002457 A1 | | 1/2013 | Tudose | |

FOREIGN PATENT DOCUMENTS

KR  10-2005-0066566   6/2005

OTHER PUBLICATIONS

Hentschel, Tim et al., "Sample Rate Conversion for Software Radio," IEEE Communications Magazine, vol. 38 (8):142-150 (2000).
Long, Jeffrey P. et al., "High Throughput Farrow Re-samplers Utilizing Reduced Complexity FIR Filters," Military Communications Conference, 6 pages (2012).

* cited by examiner

*Primary Examiner* — Brian Young
(74) *Attorney, Agent, or Firm* — Nelson Mullins Riley & Scarborough LLP

(57) ABSTRACT

A data rate conversion device generates a first parameter representing a memory address position to sample and a second parameter representing a phase value of an estimation time point, records input data at a memory based on an input clock, outputs sampled continued data from the memory using the first parameter based on an output clock, and generates and outputs final data using the continued data, a plurality of filter coefficients, and the second parameter.

18 Claims, 13 Drawing Sheets

Signal : LTE 5MHz Data Signal
Input sampling rate : 61.44MHz
Output sampling rate : 79.79MHz
Rate (=FclkIN/FclkOUT) : 0.77

DEVICE AND METHOD FOR CONVERTING DATA RATE

CROSS-REFERENCE TO RELATED APPLICATION

This application claims priority to and the benefit of Korean Patent Application No. 10-2013-0118713 filed in the Korean Intellectual Property Office on Oct. 4, 2013, the entire contents of which are incorporated herein by reference.

BACKGROUND OF THE INVENTION (a) Field of the Invention

The present invention relates to a method and device for converting a data rate of a mobile communication transmitting/receiving system.

(b) Description of the Related Art

A presently existing mobile communication transmitting/receiving system may be used with synchronization or asynchronization of a clock of a baseband modem and a clock of a radio frequency (RF) transmitting/receiving terminal. A system in which a clock of a baseband modem and a clock of an RF transmitting/receiving terminal are operated with asynchronization requests a data rate conversion device that converts from a clock rate of the baseband modem to a clock rate of the RF transmitting/receiving terminal while minimizing noise.

A general rate conversion method includes a method of converting to a rational number rate, which is M/L. In order to convert to a rational number rate, which is M/L, a method of performing down-sampling of L times, passing through a low pass filter, and performing up-sampling of M times is used. In this case, when values of M and L are embodied with a large prime number, the low pass filter should be formed with hundreds of tabs and coefficients. Accordingly, another method is a method of using a Farrow filter. In a data rate conversion device of a Farrow filter structure, when embodying hardware, hardware complexity is low, but a metastability problem occurring when using an asynchronous clock and a phase offset problem occurring due to a phase error between asynchronous clocks exist, compared with the foregoing method. Further, a problem in that a clock frequency rate error that is generated in a measurement environment should be corrected exists.

SUMMARY OF THE INVENTION

The present invention has been made in an effort to provide a method and device for converting a data rate having advantages of being capable of solving a metastability problem occurring when using an asynchronous clock and minimizing an output error due to a phase error or a clock frequency rate error between asynchronous clocks.

An exemplary embodiment of the present invention provides a device that converts a rate of input data. The data rate conversion device includes a rate counter, a phase accumulator, an asynchronous data sampler, a filter coefficient operation unit, and a phase operation unit. The rate counter calculates a rate representing a ratio of frequencies of an input clock and an output clock. The phase accumulator generates a first parameter representing a memory address position to sample using the rate, and a second parameter representing a phase value of an estimation time point. The asynchronous data sampler records data that is input based on an input clock, and outputs continued data using the first parameter based on an output clock. The filter coefficient operation unit calculates a plurality of first operation values using the continued data and a plurality of filter coefficients. The phase operation unit generates and outputs final data using the plurality of first operation values and the second parameter.

The rate counter may include an output clock counter, a counter enable generator, and an input clock counter. The output clock counter may perform a counting operation based on the output clock according to a first enable signal. The counter enable generator may generate a second enable signal using a counting value of the output clock counter, and generate a third enable signal by delaying a second enable signal based on the input clock. The input clock counter may generate the rate by performing a counting operation based on the input clock according to the first enable signal and the second enable signal.

The phase accumulator may include a rate enable generator, a rate accumulator, and a bit selection unit. The rate enable generator may generate a fifth enable signal based on the output clock using a fourth enable signal. The rate accumulator may accumulate the rate based on the output clock according to the fourth enable signal and the fifth enable signal. The bit selection unit may use some bits of a cumulative value of the rate as the first parameter and use some other bits of a cumulative value of the rate as the second parameter.

The asynchronous data sampler may include a shift register, a write address generator, an enable controller, a read address generator, and a memory. The shift register may delay and output the input data based on the input clock according to the third enable signal. The write address generator may generate a write address according to the third enable signal. The enable controller may generate the fourth enable signal and a sixth enable signal by delaying the third enable signal based on the input clock and the output clock. The read address generator may generate a plurality of read addresses for reading the continued data based on the output clock using the first parameter. The memory may record data that is output from the shift register according to the write address.

The asynchronous data sampler may further include a D flip-flop that delays the continued data that is output from the memory according to the plurality of read addresses based on the output clock, and outputs the delayed data to the filter coefficient operation unit, according to the sixth enable signal.

The enable controller may include a plurality of D flip-flops that are coupled in series, some D flip-flops that are positioned at the front of the plurality of D flip-flops may operate based on the input clock, the remaining D flip-flops of the plurality of D flip-flops may operate based on the output clock, and a sixth enable signal may be generated from an output value of a final D flip-flop of the plurality of D flip-flops.

The fourth enable signal may be generated from an output value of an immediately preceding D flip-flop of the final D flip-flop of the plurality of D flip-flops.

The read address generator may generate a first read address based on the output clock using the first parameter and generate the remaining read addresses by adding respective values from 1 to a value corresponding to a degree to obtain to the first read address based on the first read address.

The write address generator may include a multiplexer and a D flip-flop. The multiplexer may select and output a value that accumulates 1 to an immediately preceding write address according to the third enable signal. The D flip-flop may generate the write address by delaying an output value of the multiplexer based on the input clock.

The shift register may include a plurality of sub-delay units that are sequentially connected. The plurality of sub-delay units each may include: a multiplexer that selects and outputs the input data according to the third enable signal; and a D flip-flop that delays and outputs an output of the multiplexer based on the input clock, wherein an output of a D flip-flop of one sub-delay unit may be input to a multiplexer of a sub-delay unit that is positioned after the one sub-delay unit.

The filter coefficient operation unit may include a plurality of sub-operation units that calculate each of the plurality of first operation values, respectively, the plurality of sub-operation units may multiply a plurality of filter coefficients, respectively, by the continued data, and calculate the first operation value by adding multiplied values, and the number of sub-operation units may be determined according to a degree of the data rate conversion device.

The phase operation unit may include: a plurality of multipliers; and a plurality of adders that add and output a plurality of first operation values to an output value of the plurality of multipliers, respectively, wherein each of the plurality of multipliers may multiply and output an output value of a corresponding adder of the plurality of adders and the second parameter, and final data may be generated from an output value of one adder of the plurality of adders.

Another embodiment of the present invention provides a method in which a data rate conversion device converts a rate of input data. The method includes: calculating a rate representing a ratio of frequencies of an input clock and an output clock; generating a first parameter representing a memory address position to sample according to the rate and a second parameter representing a phase value of an estimation time point; recording input data based on the input clock at a memory; outputting continued data from the memory using the first parameter based on the output clock; and outputting final data using the continued data, a plurality of filter coefficients, and the second parameter.

The calculating of a rate may include counting based on the output clock according to a first enable signal; generating a second enable signal using the counting value; generating a third enable signal by delaying the second enable signal based on the input clock; and calculating the rate by counting based on the input clock according to the first enable signal and the second enable signal.

The recording of input data may include generating a write address by accumulating 1 to an immediately preceding write address based on the input clock according to a third enable signal, and the bit number of the write address may be determined according to an address length of the memory.

The method may further include: before the recording of input data, counting based on the output clock according to the first enable signal; generating a second enable signal according to a comparison result of the counting value and a threshold value; and generating a third enable signal by delaying the second enable signal based on the input clock.

The outputting of continued data may include generating a sixth enable signal by delaying the third enable signal based on the input clock and the output clock; and generating a plurality of read addresses for reading the continued data based on the first parameter and the output clock according to the sixth enable signal.

The generating of a first parameter may include: generating a fourth enable signal by delaying the third enable signal based on the input clock and the output clock; generating a fifth enable signal based on the output clock; accumulating the rate based on the output clock according to the fourth enable signal and the fifth enable signal; and setting some bits of a cumulative value of the rate to the first parameter and setting some other bits of a cumulative value of the rate to the second parameter.

The outputting of continued data may include determining a read time point of the continued data according to a sixth enable signal that delays the fourth enable signal based on the output clock.

The outputting of final data may include calculating a plurality of first operation values using the continued data and a plurality of filter coefficients, and generating the final data by applying the second parameter to each of the plurality of first operation values.

DETAILED DESCRIPTION OF THE EMBODIMENTS

Figure 1:
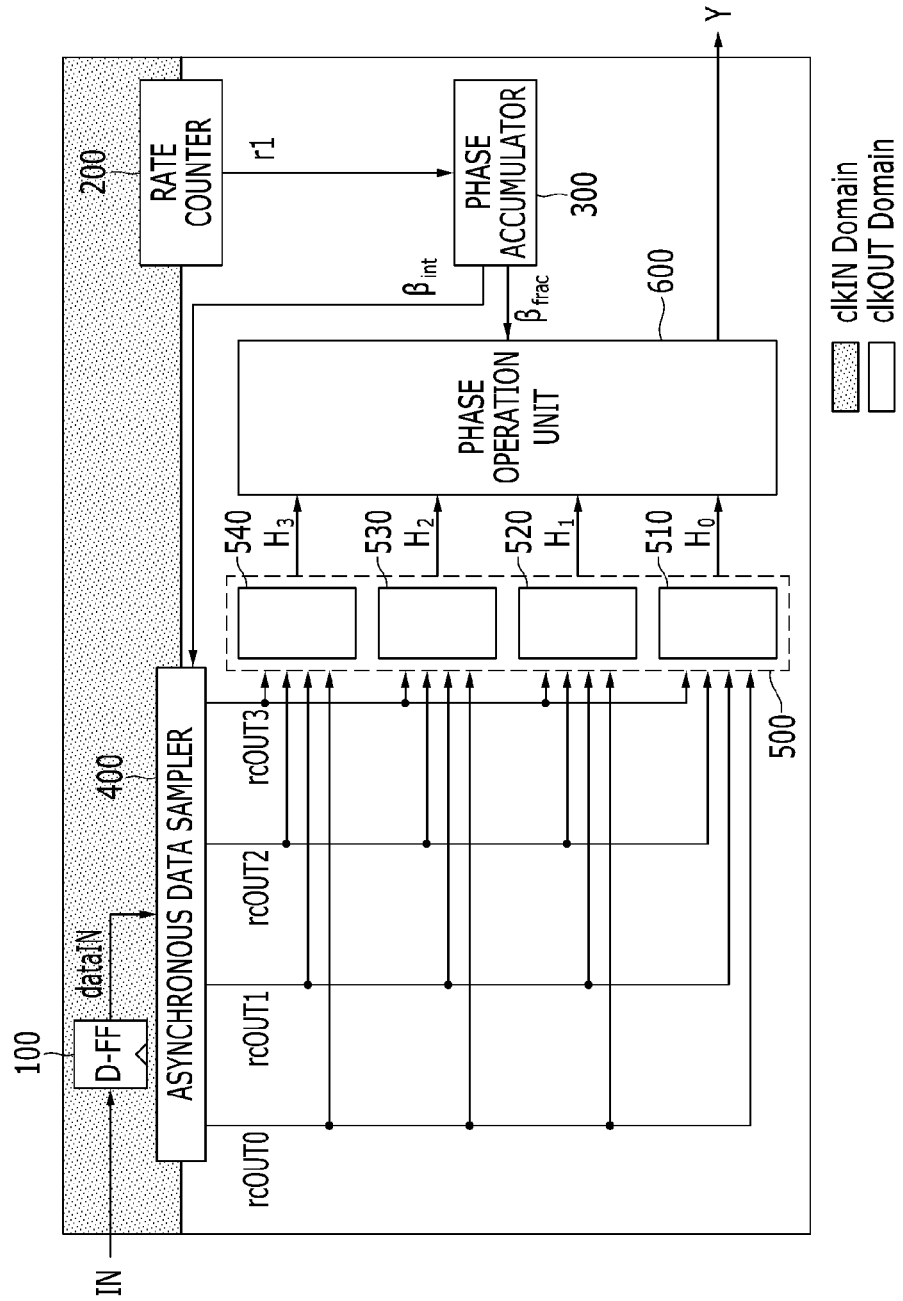
FIG. 1 is a diagram illustrating a data rate conversion device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the specification and claims, unless explicitly described to the contrary, the word "comprise" and variations such as "comprises" or "comprising" will be understood to imply the inclusion of stated elements but not the exclusion of any other elements.

Hereinafter, a method and device for converting a data rate according to an exemplary embodiment of the present invention will be described in detail with reference to the drawings.

FIG. 1 is a diagram illustrating a data rate conversion device according to an exemplary embodiment of the present invention.

Referring to FIG. 1, the data rate conversion device includes an input flip-flop 100, a rate counter 200, a phase accumulator 300, an asynchronous data sampler 400, a filter coefficient operation unit 500, and a phase operation unit 600.

The input flip-flop 100 generates data dataIN by synchronizing input data IN with an input clock clkIN, and outputs the data dataIN that is synchronized with the input clock clkIN to the asynchronous data sampler 400. A D flip-flop may be used as the input flip-flop 100.

The rate counter 200 measures frequencies of an actually operating input clock clkIN and output clock clkOUT, calculates a rate r1 corresponding to a ratio of frequencies of the input clock clkIN and the output clock clkOUT, and outputs the calculated rate r1 to the phase accumulator 300. The rate r1 may be calculated by a frequency of the input clock clkIN/a frequency of the output clock clkOUT.

The phase accumulator 300 estimates a first parameter $\beta_{int}$ representing a memory address to sample based on the rate r1 that is calculated in the rate counter 200 and a second parameter $\beta_{frac}$ representing an estimated phase position of the output clock clkOUT, outputs the first parameter $\beta_{int}$ to the asynchronous data sampler 400, and outputs the second parameter $\beta_{frac}$ to the phase operation unit 600. The second parameter $\beta_{frac}$ is a value representing a phase position of the estimated output clock clkOUT based on a phase of the input clock clkIN.

The asynchronous data sampler 400 records the data dataIN at a memory based on the input clock clkIN, generates a read address of data for reading continued data that is stored at the memory based on the first parameter $\beta_{int}$, reads continued data from the memory according to the read address, and outputs the read continued data to the filter coefficient operation unit 500. In this case, the number of continued data corresponds to a degree that is used in the data rate conversion device. Here, the degree represents a degree of a polynomial expression using for converting a data rate in the data rate conversion device. For example, when a degree that is used in the data rate conversion device is 3, four continued data rcOUT0, rcOUT1, rcOUT2, and rcOUT3 are required, and in FIG. 1, it is assumed that a degree of the data rate conversion device is 3.

The filter coefficient operation unit 500 includes a plurality of subordinate operation units. Each subordinate operation unit operates and outputs continued data that is output from the asynchronous data sampler 400 and a filter coefficient corresponding thereto. The number of the subordinate operation units or the number of the filter coefficients is determined according to a degree that is used in the data rate conversion device.

For example, when a degree of the data rate conversion device is 3, the filter coefficient operation unit 500 includes four subordinate operation units 510, 520, 530, and 540. The subordinate operation units 510, 520, 530, and 540 multiply continued data rcOUT0, rcOUT1, rcOUT2, and rcOUT3 that are output from the asynchronous data sampler 400 and four filter coefficients, respectively, calculate the sum $H_0$-$H_3$ of multiplied values, and output the calculated sum to the phase operation unit 600. The filter coefficient may be changed according to an interpolation method used.

The phase operation unit 600 generates and outputs final output data Y using output values $H_0$-$H_3$ of the filter coefficient operation unit 500 and the second parameter $\beta_{frac}$.

Figure 2:
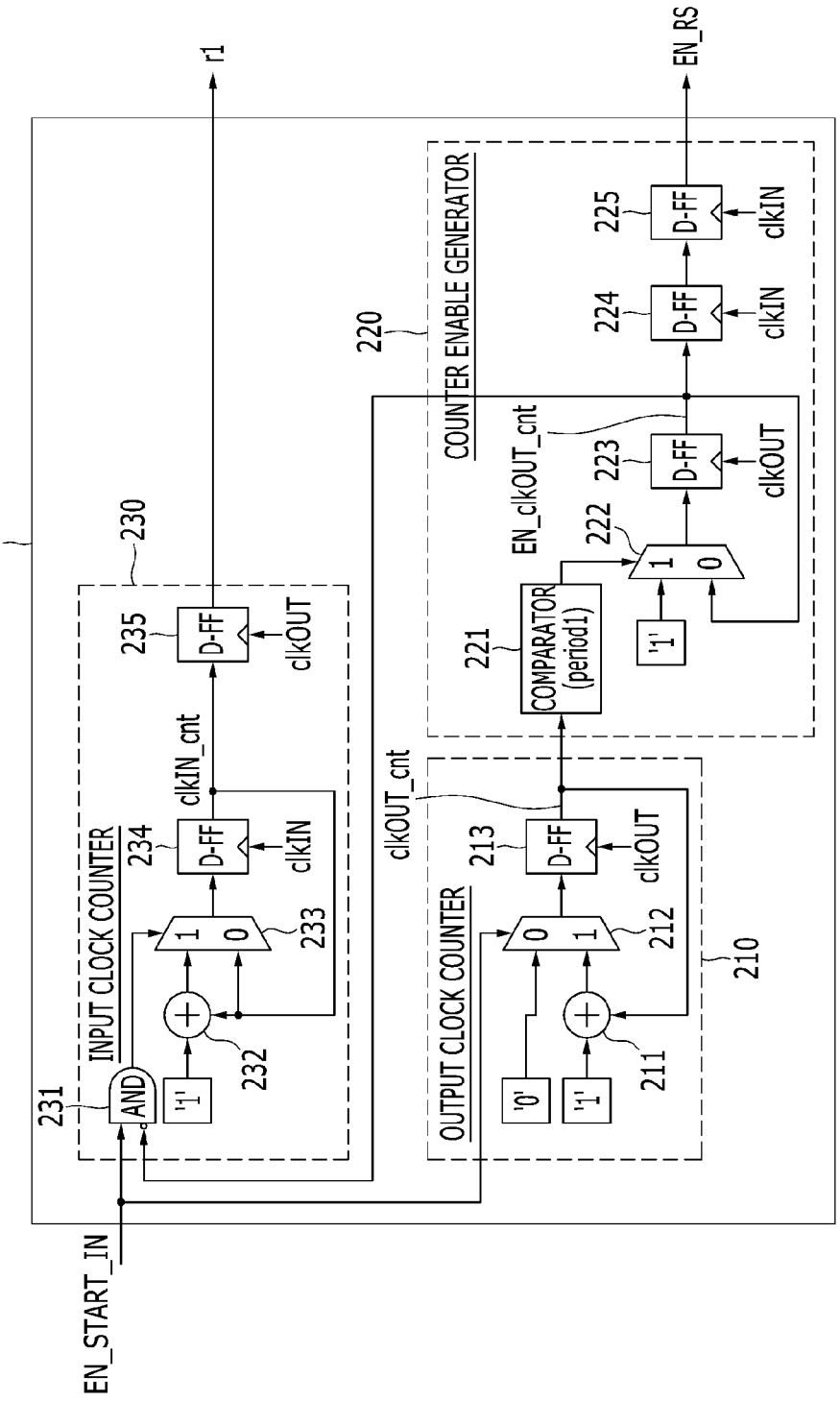
FIG. 2 is a diagram illustrating a rate counter of FIG. 1.

FIG. 2 is a diagram illustrating the rate counter of FIG. 1.

Referring to FIG. 2, the rate counter 200 includes an output clock counter 210, a counter enable generator 220, and an input clock counter 230.

The output clock counter 210 includes an adder 211, a multiplexer 212, and a D flip-flop 213. The adder 211 adds 1 and an output value clkOUT_cnt of the D flip-flop 213 and outputs the added value to the multiplexer 212. The multiplexer 212 selects one of 0 and the output value of the adder 211 according to an enable signal EN_START_IN and outputs the selected one to the D flip-flop 213. Particularly, when the enable signal EN_START_IN becomes 1, the multiplexer 212 selects the output value of the adder 211, and when the enable signal EN_START_IN become 0, the multiplexer 212 outputs 0. That is, when the enable signal EN_START_IN becomes 1, the rate counter 200 starts operation. In FIG. 2, 0 and 1 within the multiplexer 212 represent data that is selected when the enable signal EN_START_IN is 0 and 1, respectively. Similarly, 0 and 1 within multiplexers 222 and 233 represent data that is selected when the enable signal EN_START_IN is 0 and 1, respectively. In other drawings, 0 and 1 within multiplexers are similarly applied.

The D flip-flop 213 outputs an output value of the multiplexer 212 by delaying a clock based on the output clock clkOUT, and an output value clkOUT_cnt of the D flip-flop 213 is input to the adder 211 and the counter enable generator 220. The output clock counter 210 starts counting when the enable signal EN_START_IN becomes 1 based on the output clock clkOUT.

The counter enable generator 220 includes a comparator 221, the multiplexer 222, and D flip-flops 223, 224, and 225. The comparator 221 compares the output value clkOUT_cnt of the output clock counter 210 and a threshold value period1, and if the output value clkOUT_cnt of the output clock counter 210 is larger than the threshold value period1, the comparator 221 outputs 1, while if the output value clkOUT_cnt of the output clock counter 210 is not larger than the threshold value period1, the comparator 221 outputs 0. The threshold value period1 is determined according to the bit number to change the rate r1 to a fixed value. For example, when the rate r1 is changed to a value of 10 bits, the threshold value period1 may become 1024.

The multiplexer 222 selects one of 1 and an output value of the D flip-flop 223 according to an output value of the comparator 221, and outputs the selected one to the D flip-flop 223. Particularly, if the output value of the comparator 221 is 1, the multiplexer 222 outputs 1, and if the output value of the comparator 221 is 0, the multiplexer 222 outputs the output value of the D flip-flop 223. The D flip-flop 223 outputs the output value of the multiplexer 222 by delaying a clock based on the output clock clkOUT, and the output value of the D flip-flop 223 is an enable signal EN_clkOUT_cnt and is input to the multiplexer 222 and the input clock counter 230. That is, if the output value clkOUT_cnt of the output clock counter 210 is larger than the threshold value period1, the enable signal EN_clkOUT_cnt becomes 1. As the enable signal EN_clkOUT_cnt is delayed by two clocks based on the input clock clkIN by the D flip-flops 224 and 225, an enable signal EN_RS is generated.

The input clock counter 230 includes an AND gate 231, an adder 232, the multiplexer 233, and D flip-flops 234 and 235. The AND gate 231 performs and outputs an AND operation of a signal in which an enable signal EN_START_IN and an enable signal EN_clkOUT_cnt are inverted. When both inverted signals of the enable signal EN_START_IN and the enable signal EN_clkOUT_cnt are 1, the AND gate 231 outputs 1, and when both inverted signals of the enable signal EN_START_IN and the enable signal EN_clkOUT_cnt are not 1, the AND gate 231 outputs 0. The adder 232 adds 1 and an output value clkIN_cnt of the D flip-flop 234, and outputs the added value to the multiplexer 233. The multiplexer 233 selects one of an output value of the adder 232 and an output value clkIN_cnt of the D flip-flop 234 according to signals in which the enable signal EN_START_IN and the enable signal EN_clkOUT_cnt are inverted, and outputs the selected one to the D flip-flop 234. When an output value of the AND gate 231 is 1, the multiplexer 233 selects an output value of the adder 232, and when an output value of the AND gate 231 is 0, the multiplexer 233 selects the output value clkIN_cnt of the D flip-flop 234. The D flip-flop 234 outputs an output value of the multiplexer 233 by delaying a clock based on the input clock clkIN. The D flip-flop 235 delays the output value clkIN_cnt of the D flip-flop 234 by a clock based on the output clock clkOUT, generates a rate r1, and outputs the rate r1 to the phase accumulator 300. In operation of the input clock counter 230, only at a segment in which the enable signal EN_START_IN is 1 and the enable signal EN_clkOUT_cnt is 0 based on the input clock clkIN does the input clock counter 230 perform a counting operation, and at other segments, the input clock counter 230 performs a function of maintaining a previous value and generates the rate r1. Resultantly, the input clock counter 230 performs the operation of obtaining the rate r1, which is a ratio of a frequency of the output clock clkOUT and a frequency of the input clock clkIN that are generated during a specific time [=Period1*a cycle of the output clock clkOUT].

Figure 3:
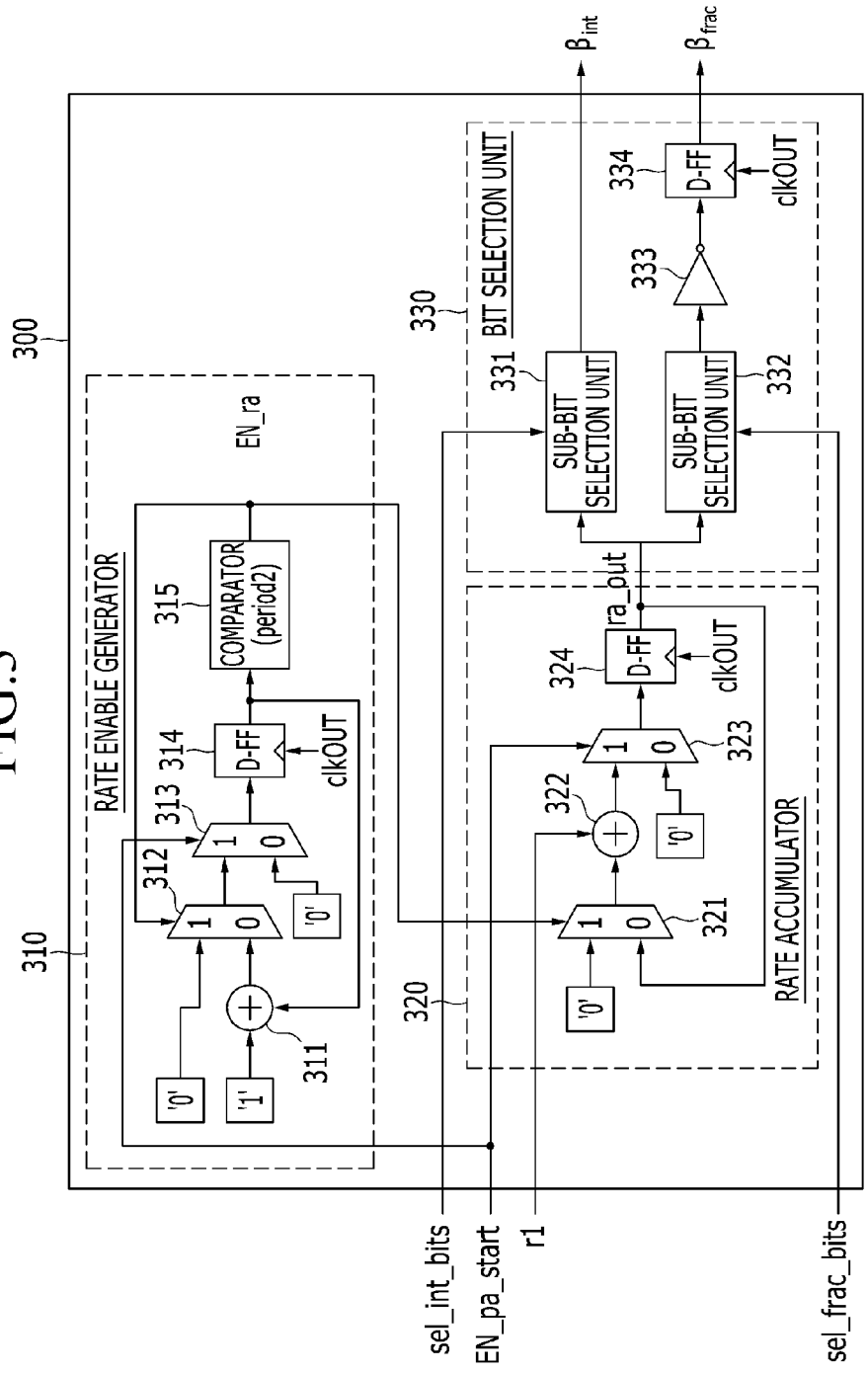
FIG. 3 is a diagram illustrating a phase accumulator of FIG. 1.

FIG. 3 is a diagram illustrating the phase accumulator of FIG. 1.

Referring to FIG. 3, the phase accumulator 300 includes a rate enable generator 310, a rate accumulator 320, and a bit selection unit 330.

The rate enable generator 310 includes an adder 311, multiplexers 312 and 313, a D flip-flop 314, and a comparator 315. The adder 311 adds 1 and an output value of the D flip-flop 314 and outputs the added value to the multiplexer 312. The multiplexer 312 selects one of 0 and an output value of the adder 311 according to an enable signal EN_ra, which is an output value of the comparator 315, and outputs the selected one to the multiplexer 313. When the enable signal EN_ra is 1, the multiplexer 312 selects 0, and when the enable signal EN_ra is 0, the multiplexer 312 selects the output value of the adder 311. The multiplexer 313 selects one of 0 and the output value of the multiplexer 312 according to an enable signal EN_pa_start, and outputs the selected one to the D flip-flop 314. When the enable signal EN_pa_start is 1, the multiplexer 313 selects the output value of the multiplexer 312, and when the enable signal EN_pa_start is 0, the multiplexer 313 selects 0. The D flip-flop 314 outputs the output value of the multiplexer 313 to the comparator 315 by delaying a clock based on the output clock clkOUT. The comparator 315 compares a threshold value period2 and the output value of the D flip-flop 314, and if the output value of the D flip-flop 314 corresponds with the threshold value period2, the comparator 315 outputs 1, while if the output value of the D flip-flop 314 does not correspond with the threshold value period2, the comparator 315 outputs 0 and generates an enable signal EN_ra. That is, when the enable signal EN_pa_start is 0, the rate enable generator 310 generates an enable signal EN_ra of 0, and when the enable signal EN_pa_start is 1 and until an output value of the D flip-flop 314 becomes a threshold value period2, the rate enable generator 310 generates an enable signal EN_ra of 0, while when the output value of the D flip-flop 314 becomes a threshold value period2, the rate enable generator 310 generates an enable signal EN_ra of 1. When the enable signal EN_ra is 1, a value of the rate accumulator 320 is initialized. That is, the enable signal EN_ra performs an operation that initializes the rate accumulator 320.

The rate accumulator 320 includes a multiplexer 321, an adder 322, a multiplexer 323, and a D flip-flop 324. The multiplexer 321 selects one of 0 and an output value ra_out of the D flip-flop 324 according to the enable signal EN_ra, and outputs the selected one to the adder 322. When the enable signal EN_ra is 1, the multiplexer 321 selects 0, and when the enable signal EN_ra is 0, the multiplexer 321 selects an output value ra_out of the D flip-flop 324. The adder 322 adds the output value of the multiplexer 321 and a rate r1, and outputs the added value to the multiplexer 323. The multiplexer 323 selects one of 0 and an output value of the adder 322 according to the enable signal EN_pa_start, and outputs the selected one to the D flip-flop 324. When the enable signal EN_pa_start is 0, the multiplexer 323 selects 0, and when the enable signal EN_pa_start is 1, the multiplexer 323 selects an output value of the adder 322. The D flip-flop 324 delays and outputs the output value of the multiplexer 323 by a clock based on the output clock clkOUT. The output value ra_out of the D flip-flop 324 is input to the multiplexer 321 and the bit selection unit 330. In operation of the rate accumulator 320, when the enable signal EN_pa_start is 0 based on the enable signal EN_pa_start and the enable signal EN_ra, the output value ra_out of the D flip-flop 324 becomes 0, and when the enable signal EN_pa_start is 1 and the enable signal EN_ra is 0, the output value ra_out of the D flip-flop 324 becomes a sum of a value of the input rate r1 and an immediately preceding output value ra_out. When the enable signal EN_pa_start is 1 and the enable signal EN_ra is 1, the output value ra_out of the D flip-flop 324 becomes a sum of a value of the input rate r1 and 0.

Next, the bit selection unit 330 includes sub-bit selection units 331 and 332, an inverter 333, and a D flip-flop 334. The sub-bit selection unit 331 selects and outputs the high-order bit number of the output value ra_out of the rate accumulator 320 according to an input parameter sel_int_bits value. The output value of the sub-bit selection unit 331 becomes a first parameter $\beta_{int}$. The sub-bit selection unit 332 selects and outputs the next high-order bit number from the output value ra_out of the rate accumulator 320, except for high-order bits that are selected by the sub-bit selection unit 331 among entire bits according to an input parameter sel_frac_bits value. For example, when the bit number of the output value ra_out of the rate accumulator 320 is 32 bits, the input parameter sel_int_bits is 3, and the input parameter sel_frac_bits is 20, the sub-bit selection unit 331 selects and outputs high-order 3 bits ra_out [31:29] of the output value ra_out, and the sub-bit selection unit 332 selects and outputs high-order 20 bits ra_out [28:6], except for high-order 3 bits ra_out [31:29] of the output value ra_out that is selected by the sub-bit selection unit 331. The inverter 333 inverts and outputs the output value of the sub-bit selection unit 332, and the D flip-flop 334 delays and outputs the output value of the inverter 333 by a clock based on the output clock clkOUT. The output value of the D flip-flop 334 becomes a second parameter $\beta_{frac}$.

The first parameter $\beta_{int}$ is an address for reading data that is written at a memory, and the input parameter sel_int_bits is the bit number that is used for generating an address for reading data that is written at the memory and is determined according to a size of the memory. For example, when a memory having 8 addresses is used, in order to represent 8 addresses, a minimum of three bits ($2^3$=8) are required, and thus an input parameter sel_int_bits may be 3.

The second parameter $\beta_{frac}$ is a value representing a phase position of an estimated output clock clkOUT based on a phase of the input clock clkIN, is a phase value of the output clock clkOUT for estimating a value between sampled data based on sampled data (e.g., rcOUT0 to rcOUT3), and is used by the phase operation unit 600. The input parameter sel_frac_bits determines a resolution of the second parameter $\beta_{frac}$, and, may be determined according to a signal to noise ratio that is requested in a system.

Figure 4:
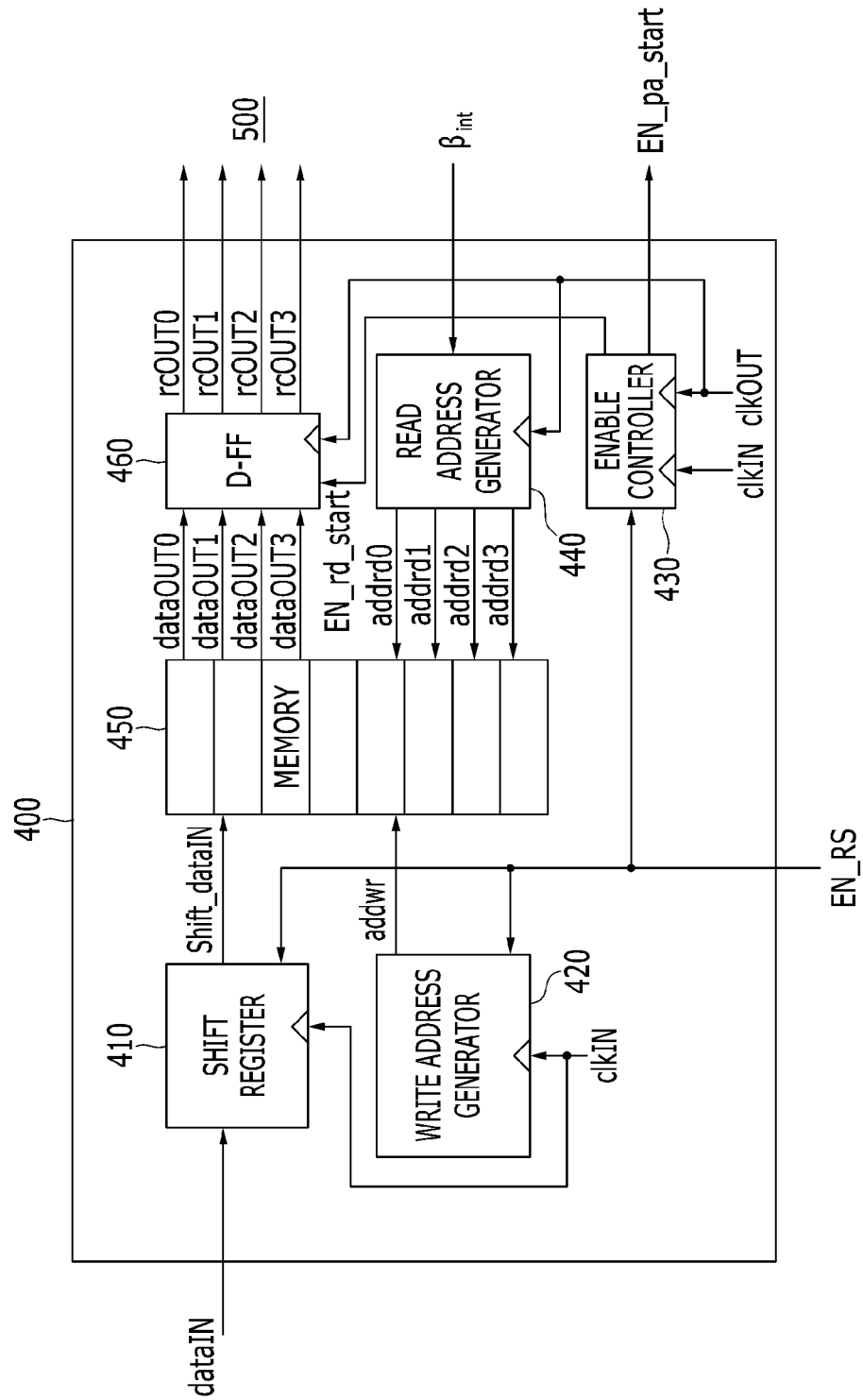
FIG. 4 is a diagram illustrating an asynchronous data sampler of FIG. 1.

FIG. 4 is a diagram illustrating the asynchronous data sampler of FIG. 1.

Referring to FIG. 4, the asynchronous data sampler 400 includes a shift register 410, a write address generator 420, an enable controller 430, a read address generator 440, a memory 450, and a D flip-flop 460.

The shift register 410 delays and outputs input data dataIN by synchronizing with the input clock clkIN according to the enable signal EN_RS.

The write address generator 420 generates a write address addwr representing a position to store output data Shift_dataIN of the shift register 410 at the memory 450 according to the enable signal EN_RS.

The enable controller 430 generates enable signals EN_pa_start and EN_rd_start representing the operation start of the phase accumulator 300 and a read time point of the memory 450 according to the enable signal EN_RS.

The read address generator 440 receives an input of the first parameter $\beta_{int}$ from the phase accumulator 300, and generates read addresses addrd0~addrd3 for reading continued data that is stored at the memory 450 based on the first parameter $\beta_{int}$.

The memory 450 records the output data shift_dataIN of the shift register 410 according to the write address addwr, reads data dataOUT0, dataOUT1, dataOUT2, and dataOUT3 that are stored at the memory 450 according to read addresses addrd0-addrd3, and outputs the data dataOUT0, the dataOUT1, dataOUT2, and the dataOUT3 to the D flip-flop 460. Such a memory 450 may be a ring-type memory.

The D flip-flop 460 outputs data dataOUT0, dataOUT1, dataOUT2, and dataOUT3 that are output from the memory 450 based on the output clock clkOUT and the enable signal EN_rd_start to the filter coefficient operation unit 500.

Figure 5:
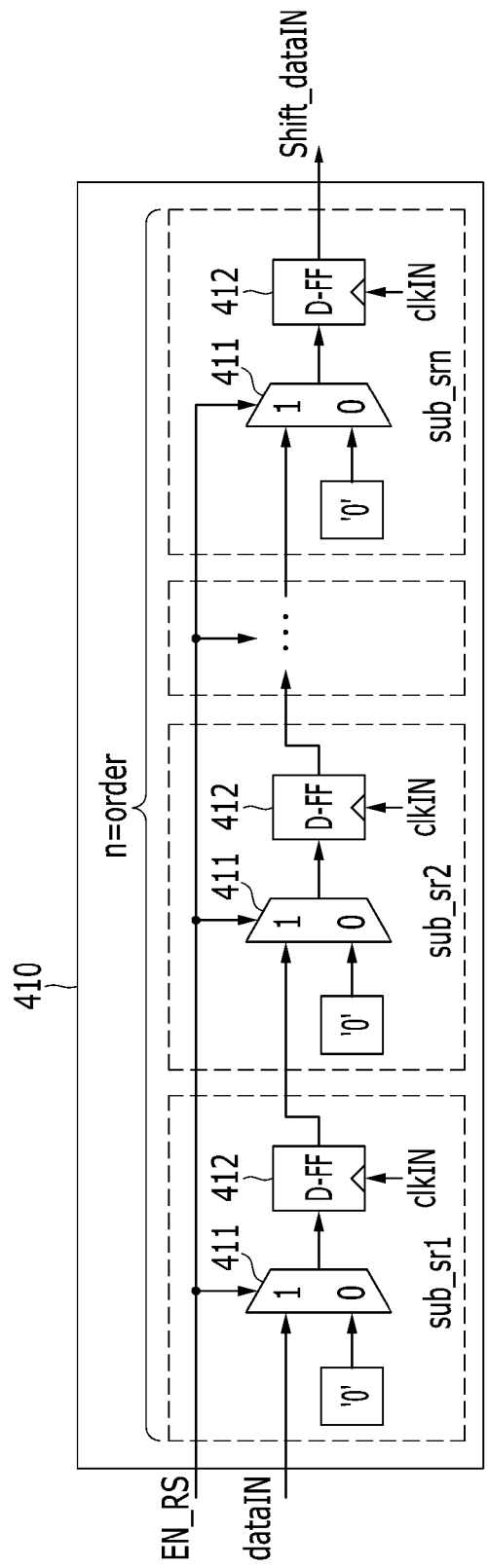
FIG. 5 is a diagram illustrating a shift register of FIG. 4.

FIG. 5 is a diagram illustrating the shift register of FIG. 4.

Referring to FIG. 5, the shift register 410 includes a plurality of sub-delay units sub_SR1, sub_SR2, . . . , sub_SRn. n is determined according to a degree of a data rate conversion device. The shift register 410 includes a multiplexer 411 and a D flip-flop 412. The data dataIN is input to the multiplexer 411 of the sub-delay unit sub_SR1. The D flip-flop 412 of the sub-delay unit sub_SR1 inputs an output value of the multiplexer 411 of the sub-delay unit sub_SR1 to the multiplexer 411 of the sub-delay unit sub_SR2 by delaying a clock based on the input clock clkIN. The D flip-flop 412 of the sub-delay unit sub_SR2 inputs an output value of the multiplexer 411 of the sub-delay unit sub_SR2 to the multiplexer 411 of the sub-delay unit sub_SR3 by delaying a clock based on the input clock clkIN. In such a way, the sub-delay units sub_SR1, sub_SR2, . . . , sub_SRn are coupled in series. An output value of the D flip-flop 412 of the final sub-delay unit sub_SRn becomes output data shift_dataIN of the shift register 410. The multiplexer 411 of the sub-delay units sub_SR1, sub_SR2, . . . , sub_SRn selects and outputs one of 0 and input data (dataIN or an output value of a D flip-flop 412 of an immediately preceding sub-delay unit) according to the enable signal EN_RS. In this case, when the enable signal EN_RS is 1, data (dataIN or an output value of the D flip-flop 412 of an immediately preceding sub-delay unit) is selected, and when the enable signal EN_RS is 0, 0 is selected. Finally, when the enable signal EN_RS is 0, output data shift_dataIN of the shift register 410 becomes 0 and thus the shift register 410 enters a state in which it does not operate, and when the enable signal EN_RS is 1, the output data shift_dataIN of the shift register 410 becomes a value in which data dataIN is delayed by a degree of the data rate conversion device based on the input clock clkIN.

Figure 6:
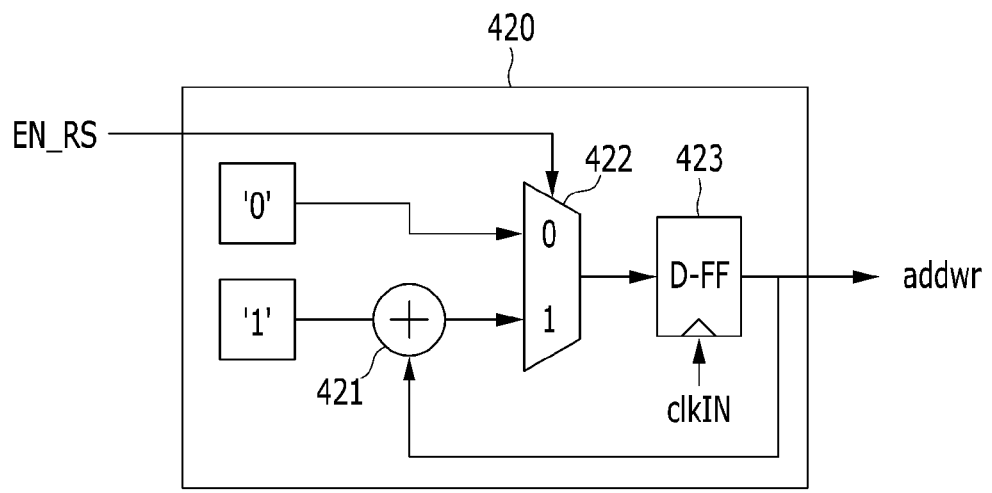
FIG. 6 is a diagram illustrating a write address generator of FIG. 4.

FIG. 6 is a diagram illustrating the write address generator of FIG. 4.

Referring to FIG. 6, the write address generator 420 includes an adder 421, a multiplexer 422, and a D flip-flop 423. The adder 421 adds 1 and an output value addwr of the D flip-flop 423 and outputs the added value to the multiplexer 422. The multiplexer 422 selects one of 0 and an output value addwr of the adder 421 according to an enable signal EN_RS and outputs the selected one to the D flip-flop 423. When the enable signal EN_RS is 0, the multiplexer 422 selects 0, and when the enable signal EN_RS is 1, the multiplexer 422 outputs an output value of the adder 421, i.e., a value in which 1 is added to a previous write address addwr. The D flip-flop 423 generates a write address addwr by delaying an output value of the multiplexer 422 by a clock based on the input clock clkIN and outputs a write address addwr.

That is, when the enable signal EN_RS is 0, the write address generator 420 outputs a write address addwr of 0, and when the enable signal EN_RS is 1, the write address generator 420 outputs a write address addwr in which 1 is accumulated at a previous write address addwr. In this case, the bit number of the write address addwr is changed according to an address length of the memory 450. For example, when an address length of the memory 450 is 8, the bit number of the write address addwr is set to 3 bits. Finally, when the enable signal EN_RS is 1, the write address generator 420 has a write address addwr that is repeated from 0-7 based on the input clock clkIN. Therefore, input output data shift_dataIN of the shift register 410 is stored at [0] number address of the memory 450 based on the moment in which the enable signal EN_RS is changed from 0 to 1, and next data shift_dataIN is stored at [1] number address of the memory 450.

Figure 7:
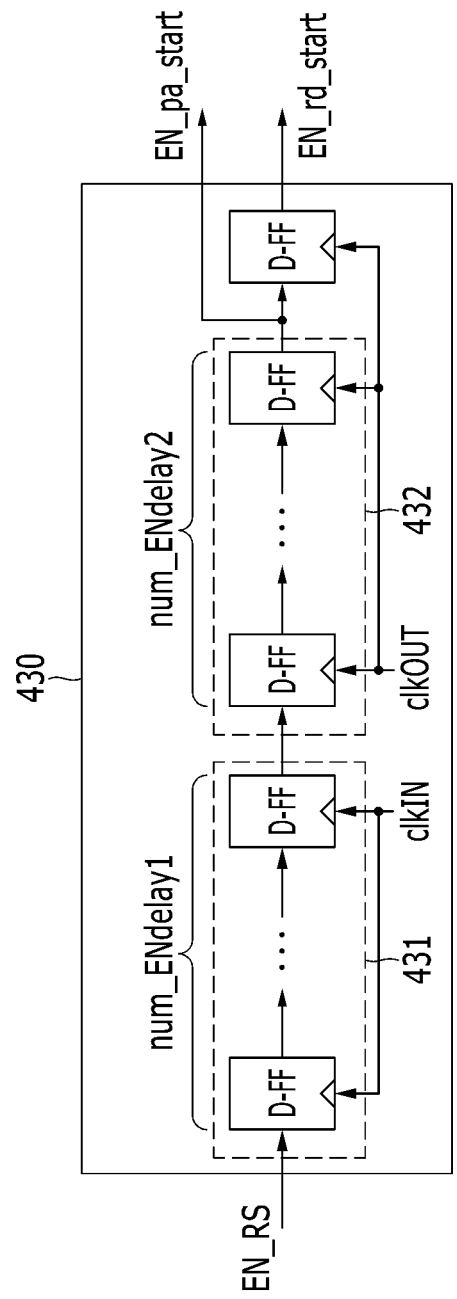
FIG. 7 is a diagram illustrating an enable controller of FIG. 4.

FIG. 7 is a diagram illustrating the enable controller of FIG. 4.

Referring to FIG. 7, the enable controller 430 includes a plurality of D flip-flops that are coupled in series.

A first delay unit 431 includes some D flip-flops that are positioned at the front of the plurality of D flip-flops. The plurality of D flip-flops of the first delay unit 431 delay and output an enable signal EN_RS that is input by synchronizing with the input clock clkIN.

A second delay unit 432 includes the remaining D flip-flops, except for a final D flip-flop and some D flip-flops that are positioned at the front of the plurality of D flip-flops. The plurality of D flip-flops of the second delay unit 432 delay and output the enable signal EN_RS that is input by synchronizing with the output clock clkOUT. In this case, an output signal of a final D flip-flop of the plurality of D flip-flops becomes an enable signal EN_rd_start, and an output signal of a D flip-flop that is positioned immediately before a final D flip-flop of the plurality of D flip-flops becomes an enable signal EN_pa_start.

The enable signals EN_pa_start and EN_rd_start are enable signals representing the operation start of the phase accumulator 300 and a time point that reads data that is written at the memory 450, and a read time point may be changed according to a degree that is used in the data rate conversion device and an address length of the memory 450.

For example, when an address length of the memory 450 is 8, and a degree of a data rate conversion device is 3, the number num_ENdelay1 of D flip-flops of the first delay unit 431 may be 4, and the number num_ENdelay2 of D flip-flops of the second delay unit 432 may be 3. That is, a memory address position to sample data is selected as a time point that may sample entire data from data of [3] number address to data of [2] number address, [1] number address, and [0] number address of the memory 450 based on a time point at which the enable signal EN_RS is changed from 0 to 1, and in this case, a time point at which a change of data is minimized is selected. A memory address position to sample data can solve a metastability problem occurring when being operated with an asynchronous clock.

Because an address length of the memory 450 should not exceed 8, the number num_ENdelay1 of D flip-flops of the first delay unit 431 and the number num_ENdelay2 of D flip-flops of the second delay unit 432 may be selected from num_ENdelay1<8 and num_ENdelay2<8.

Because the phase accumulator 300 operates based on the enable signal EN_pa_start, write addresses addrd0-addrd3 based on an output value $\beta_{int}$ of the phase accumulator 300 are delayed by a clock based on the output clock clkOUT. Therefore, because a position to sample data in the memory 450 should be set based on a time point that is delayed by a clock, an enable signal EN_rd_start is generated by delaying by a clock. This delay value may be changed according to a hardware structure.

Figure 8:
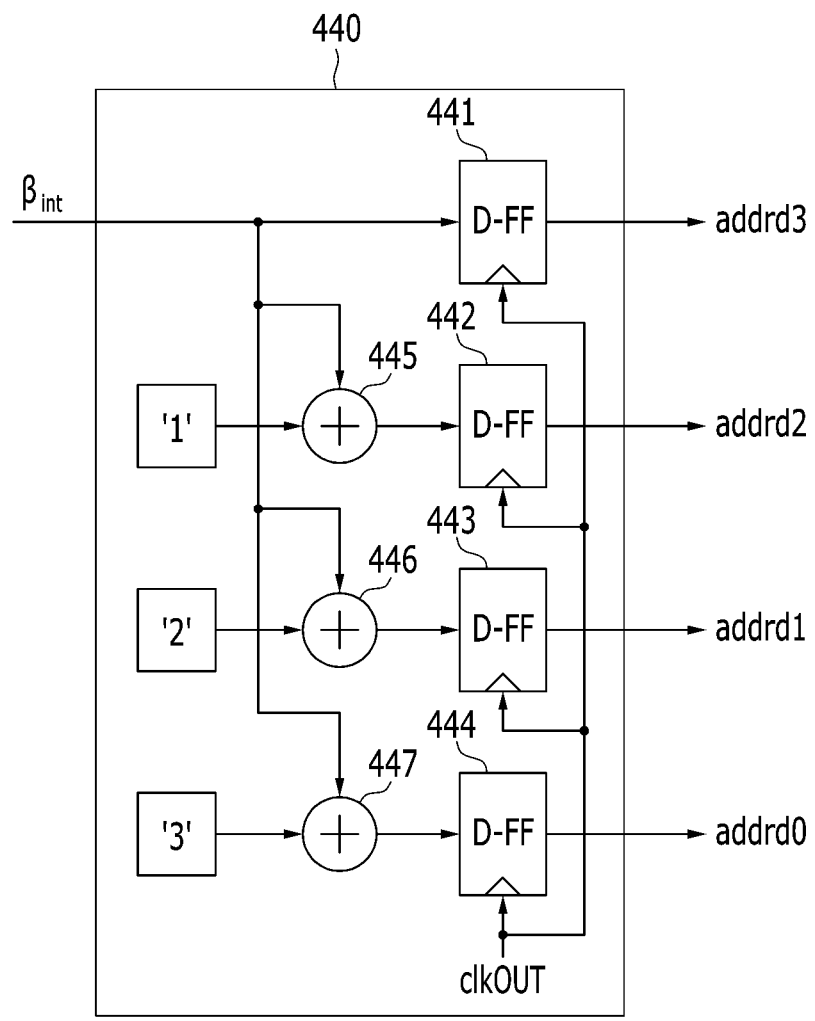
FIG. 8 is a diagram illustrating a read address generator of FIG. 4.

FIG. 8 is a diagram illustrating the read address generator of FIG. 4.

Referring to FIG. 8, the read address generator 440 receives an input of a first parameter $\beta_{int}$ from the phase accumulator 300, and generates read addresses addrd0-addrd3 for reading continued data that is stored at the memory 450 based on the first parameter $\beta_{int}$. The read address generator 440 includes D flip-flops 441, 442, 443, and 444 and adders 445, 446, and 447. The first parameter $\beta_{int}$ is input to the D flip-flop 441, and the D flip-flop 441 delays the first parameter $\beta_{int}$ by a clock based on an output clock clkOUT and generates a read address addrd3. The adder 445 adds the first parameter $\beta_{int}$ and 1 and outputs the added value (=$\beta_{int}$+1) to the D flip-flop 442. The D flip-flop 442 delays the added value (=$\beta_{int}$+1) of the adder 445 by a clock based on the output clock clkOUT and generates a read address addrd2. The adder 446 adds the first parameter $\beta_{int}$ and 2 and outputs an added value (=$\beta_{int}$+2) to the D flip-flop 443. The D flip-flop 443 delays the added value (=$\beta_{int}$+2) of the adder 446 by a clock based on the output clock clkOUT and generates a read address addrd1. The adder 447 adds the first parameter $\beta_{int}$ and 3 and outputs an added value (=$\beta_{int}$+3) to the D flip-flop 444. The D flip-flop 444 delays the added value (=$\beta_{int}$+3) of the adder 447 by a clock based on the output clock clkOUT and generates a read address addrd0.

Finally, the read address generator 440 generates read addresses addrd0-addrd3 for reading continued data that is stored at the memory 450 by delaying a clock based on the output clock clkOUT using the first parameter $\beta_{int}$ representing a memory address to sample as a time point.

In this illustration, because a degree of the data rate conversion device is 3, in order for the memory 450 to read data, four read addresses are required. A reference value for generating four read addresses is a read address addrd3, and by adding a value of 1-3 corresponding to a degree to obtain to the reference value, read addresses addrd0-addrd2 are generated.

Figure 9:
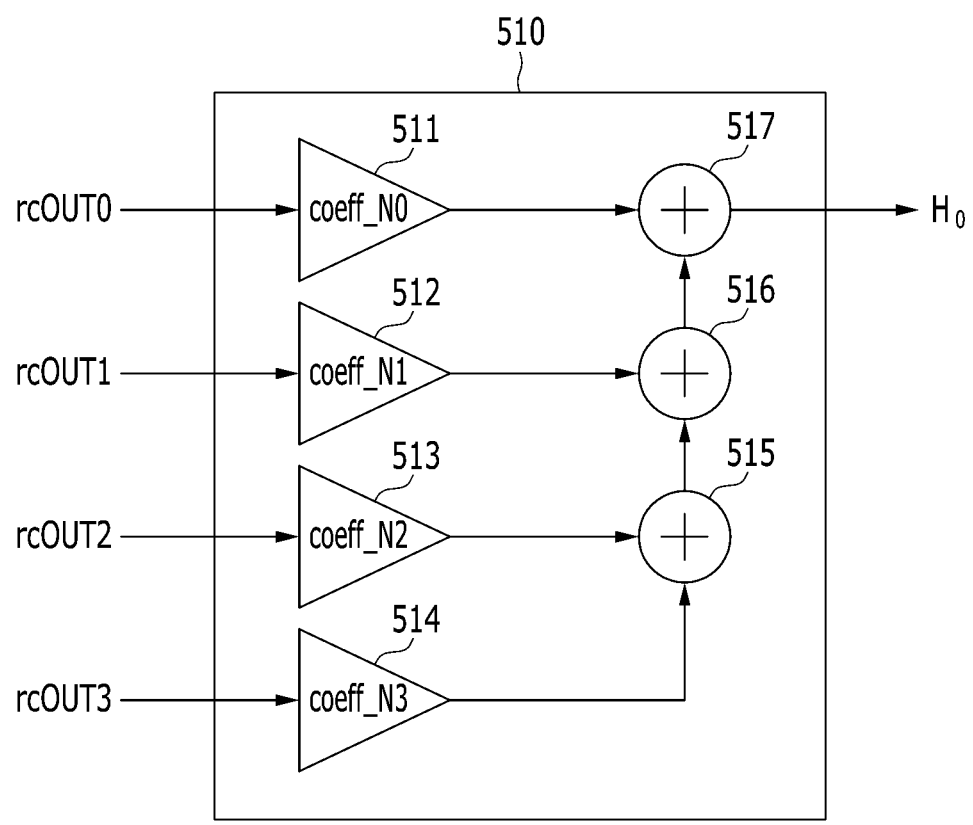
FIG. 9 is a diagram illustrating a subordinate operation unit of a filter coefficient operation unit of FIG. 1.

FIG. 9 is a diagram illustrating a subordinate operation unit of the filter coefficient operation unit of FIG. 1, and FIG. 9 illustrates only one subordinate operation unit 510 for convenience, but subordinate operation units 520, 530, and 540 may be formed equally to the subordinate operation unit 510.

Referring to FIG. 9, the subordinate operation unit 510 includes multipliers 511, 512, 513, and 514 and adders 515, 516, and 517. The multiplier 511 multiplies data rcOUT0 and a filter coefficient coeff_N0 and outputs a multiplied value to the adder 517. The multiplier 512 multiplies data rcOUT1 and a filter coefficient coeff_N1 and outputs a multiplied value to the adder 516. The multiplier 513 multiplies data rcOUT2 and a filter coefficient coeff_N2 and outputs a multiplied value to the adder 515. The multiplier 514 multiplies data rcOUT3 and a filter coefficient coeff_N3 and outputs a multiplied value to the adder 515. The adder 515 adds output values of the multipliers 513 and 514 and outputs an added value to the adder 516. The adder 516 adds an output value of the multiplier 512 and an output value of the adder 515 and outputs an added value to the adder 517. The adder 517 adds an output value of the multiplier 511 and an output value of the adder 516 and generates an output value $H_0$ of the subordinate operation unit 510. The filter coefficients coeff_N0, coeff_N1, coeff_N2, and coeff_N3 may be changed according to an interpolation method in use.

Figure 10:
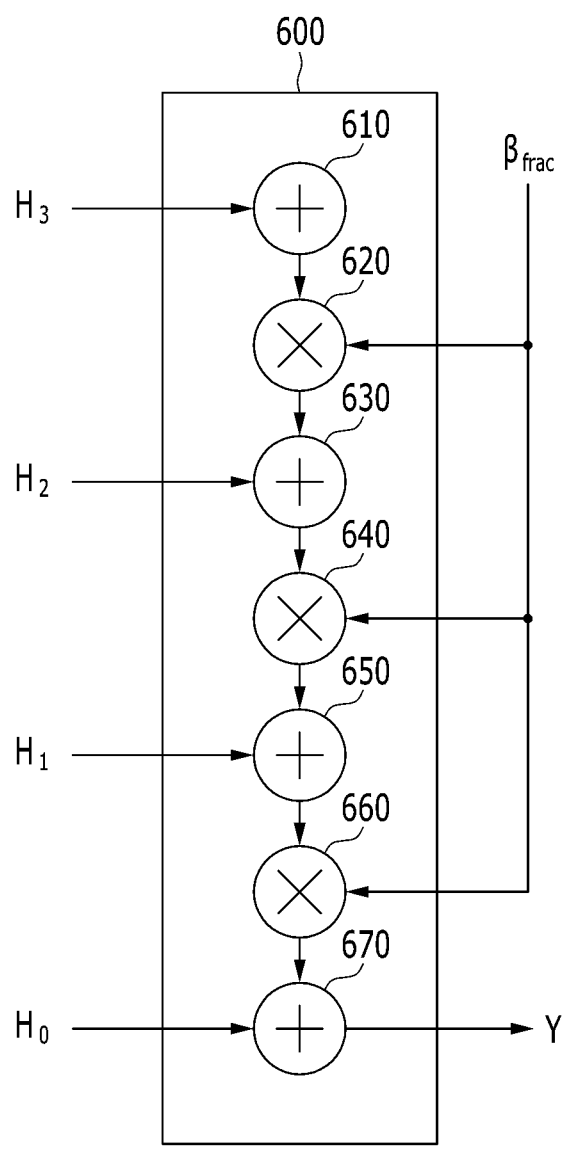
FIG. 10 is a diagram illustrating a phase operation unit of FIG. 1.

FIG. 10 is a diagram illustrating the phase operation unit of FIG. 1.

Referring to FIG. 10, the phase operation unit 600 includes a plurality of adders 610, 630, 650, and 670 and a plurality of multipliers 620, 640, and 660. The adder 610 outputs an output value $H_3$ of the subordinate operation unit 540 to the multiplier 620, and the multiplier 620 multiplies the output value of the adder 610, i.e., the output value $H_3$ of the subordinate operation unit 540, and the second parameter $\beta_{frac}$, and outputs the multiplied value to the adder 630. The adder 630 adds an output value $H_2$ of the subordinate operation unit 530 and an output value of the multiplier 620, and outputs the added value to the multiplier 640. The multiplier 640 multiplies an output value of the adder 630 and the second parameter $\beta_{frac}$, and outputs the multiplied value to the adder 650. The adder 650 adds an output value $H_1$ of the subordinate operation unit 520 and an output value of the multiplier 640, and outputs the added value to the multiplier 660. The multiplier 660 multiplies an output value of the adder 650 and the second parameter $\beta_{frac}$, and outputs the multiplied value to the adder 670. The adder 670 adds an output value $H_0$ of the subordinate operation unit 510 and an output value of the multiplier 660, and generates output data Y of the data rate conversion device.

An object of a data rate conversion device according to an exemplary embodiment of the present invention is to output data in which a data rate is converted based on data that is sampled with an input clock clkIN.

In a situation that is operated with an asynchronous clock, the most important element to perform such an object is to perform a function of the phase operation unit 600 by synchronizing the second parameter $\beta_{frac}$ that is generated in the phase accumulator 300 and the output values $H_0$-$H_3$ of the filter coefficient operation unit 500, which is sampled data. In order to minimize an error that is generated while using an asynchronous clock, an accurate operation of the phase operation unit 600 is required, and an accurate operation of the phase operation unit 600 can be solved using the previously described rate counter 200, phase accumulator 300, asynchronous data sampler 400, and filter coefficient operation unit 500.

Figure 11:
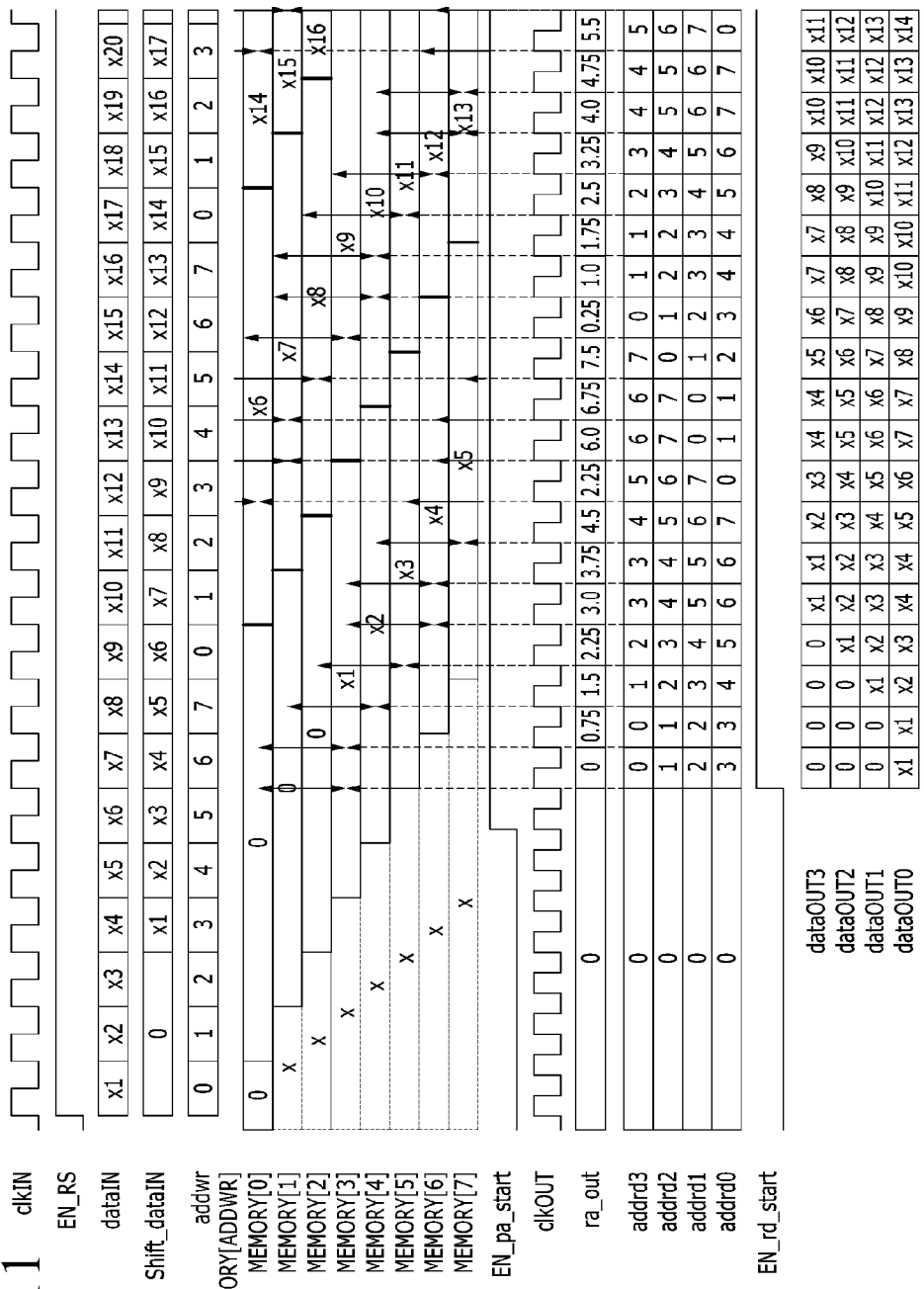
FIG. 11 is a diagram illustrating an example of a timing diagram of a data rate conversion device according to an exemplary embodiment of the present invention.

FIG. 11 is a diagram illustrating an example of a timing diagram of a data rate conversion device according to an exemplary embodiment of the present invention, and in FIG. 11, it is assumed that a rate r1 that is obtained in the rate counter 200 is 0.75, and FIG. 11 illustrates a converting process of a data rate conversion device from a time point at which the enable signal EN_RS is changed from 0 to 1.

Referring to FIG. 11, when the enable signal EN_RS changes from 0 to 1, the shift register 410 outputs data shift_dataIN by delaying data dataIN that is synchronized with the input clock clkIN by 3 clocks (degree=3) based on an input clock clkIN. In this case, a write address addwr of the memory 450 for writing data in the memory 450 in which an address length is 8 has a value of 0-7 based on the input clock clkIN from a time point at which the enable signal EN_RS becomes 1, and this process is repeated. In the memory 450, the data shift_dataIN is written according to the write address addwr. For example, when the write address addwr is 3, at an address [3] of the memory 450, the data shift_dataIN x1 is written based on the input clock clkIN. When the address addwr is 4, at an address [4] of the memory 450, the data shift_dataIN x2 is written based on the input clock clkIN.

In this way, because the write address addwr of the memory 450 is counted from 0-7, a time of holding input data per each write address is increased to 8 times. In an asynchronous clock system, at a rise or drop edge segment of an operated clock, when input data is changed, a metastability problem in which an error occurs in an output value thereof occurs. Such a metastability problem can be solved by increasing a time of holding data of the memory 450.

Next, when it is set to a value of num_ENdelay1=4 and num_ENdelay2=2, after an enable signal EN_RS is delayed by 4 clocks based on the input clock clkIN, when the output clock clkOUT is delayed by 2 clocks, an enable signal EN_pa_start may be generated. The enable signal EN_rd_start is a signal that is set to sample a [3]rd address of the memory 450 after about 3 clocks based on the output clock clkOUT.

From a time point at which the enable signal EN_pa_start becomes 1, the phase accumulator 300 accumulates a value of a rate (r1 of FIG. 3) and a previous output value (ra_out of FIG. 3) every output clock clkOUT, and generates an output value ra_out. The value ra_out that is generated in the phase accumulator 300 is formed with a value of an integer portion and a value of a decimal portion, and in this case, the value of the integer portion becomes $\beta_{int}$ and the value of the decimal portion becomes $\beta_{frac}$. $\beta_{int}$ is a value that determines a time point at which data is read in the memory 450, read addresses addrd0-addrd3 are generated based on $\beta_{int}$, and data dataOUT0-dataOUT3 are output based on such read addresses addrd0-addrd3. By performing multiplication and addition operations by corresponding calculation time points of $\beta_{frac}$ and $H_0$-$H_3$, final output data Y of the data rate conversion device is generated. Because such a calculation method is used, in the data rate conversion device based on an asynchronous clock, an influence of a phase error between input/output clocks can be minimized.

Figure 12:
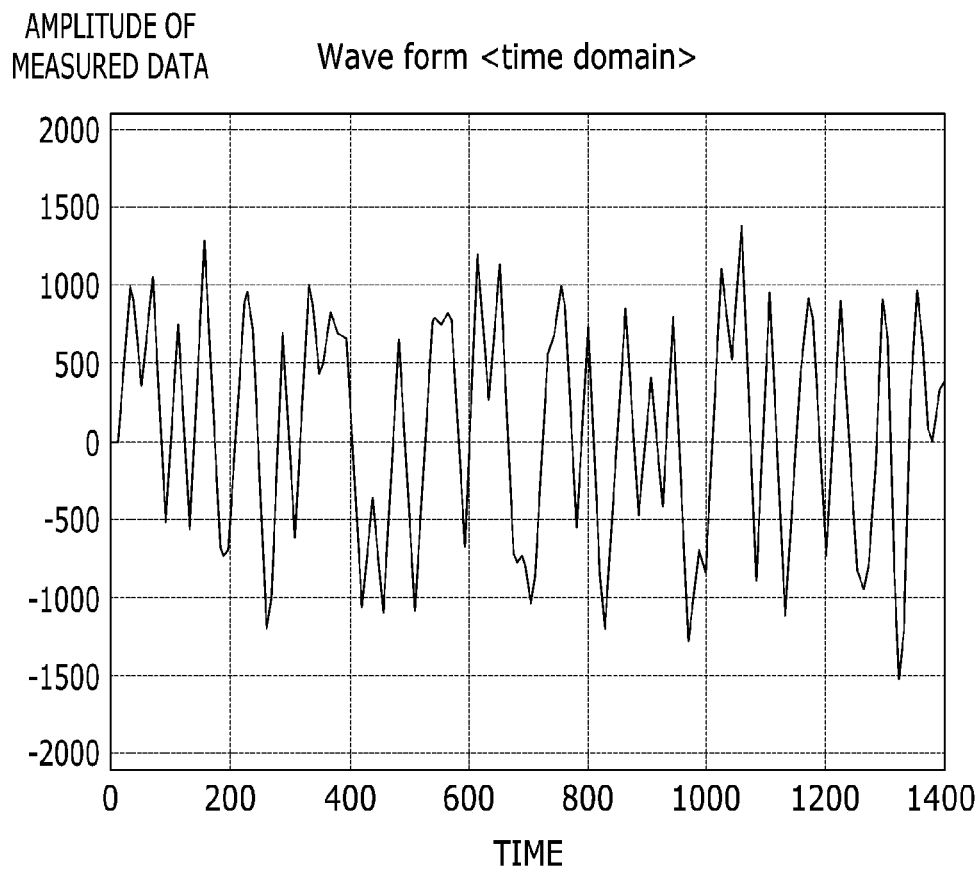
FIGS. 12 and 13 are graphs simulating a measurement result of a data rate conversion device according to an exemplary embodiment of the present invention.
Figure 13:
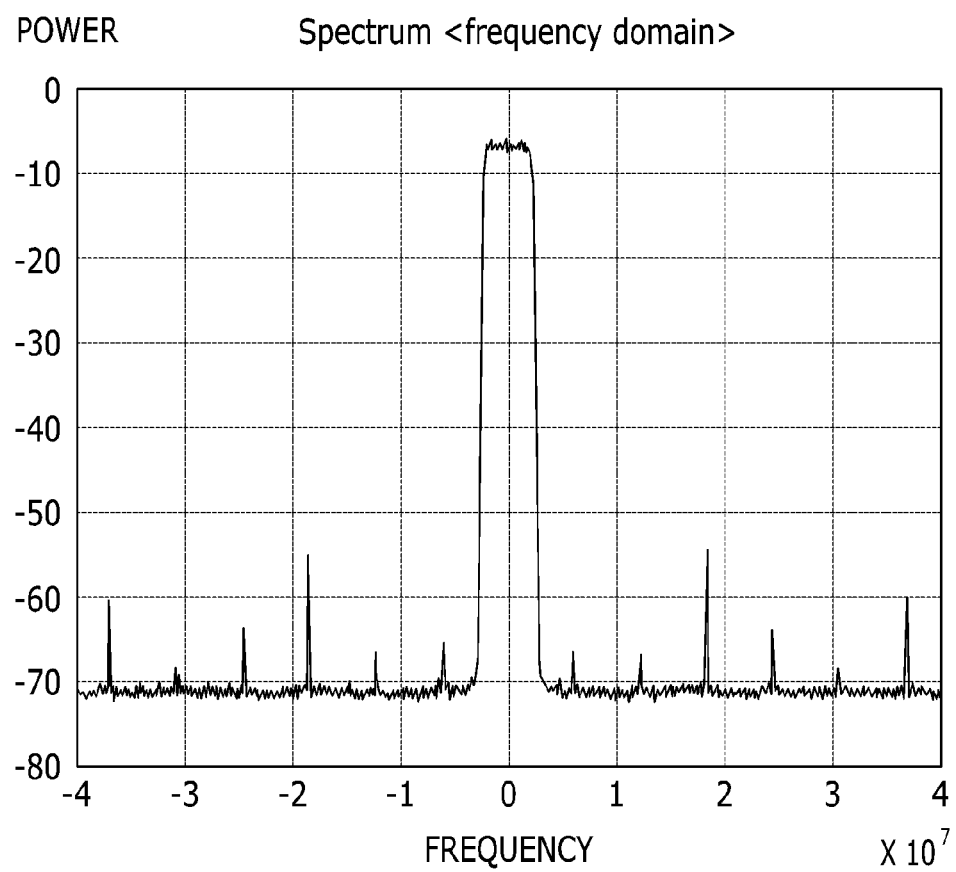

FIGS. 12 and 13 are graphs simulating a measurement result of a data rate conversion device according to an exemplary embodiment of the present invention. In FIGS. 12 and 13, an input data sampling rate is 61.44 MHz, an output data sampling rate is 79.79 MHz, a value at which a rate is about 0.77 is set, and an I channel data signal of LTE 5 MHz is measured.

FIG. 12 is a graph illustrating an output of a data rate conversion device according to an exemplary embodiment of the present invention, and illustrates an amplitude value of an I channel data signal of LTE 5 MHz according to a time change.

In FIG. 12, an input data sampling rate of a data rate conversion device is 61.44 MHz, but FIG. 12 shows a result in which an output data sampling rate in which a rate r1 is 0.77 times was converted to 79.79 MHz.

FIG. 13 is a graph illustrating a signal that is shown in FIG. 12 as a power value according to a frequency axis, and when viewing the spectrum that is shown in FIG. 13, it can be determined that a gap between a signal component and a noise component was converted to an output rate while maintaining performance of about 60 dB or more.

In this way, a data rate conversion device according to an exemplary embodiment of the present invention can perform data rate conversion with excellent performance while using a simple structure.

According to an exemplary embodiment of the present invention, by increasing a holding time of data using a memory, a metastability problem occurring when using an asynchronous clock can be solved.

By measuring a ratio of a frequency of an input clock and a frequency of an output clock in an actual hardware environment, a data rate conversion device is operated and thus an output error of the data rate conversion device can be minimized, and because a position of a memory to sample is estimated through an accumulation value of a rate that is calculated in a read process of the memory, an output error due to a phase error between clocks occurring by using an asynchronous clock can be minimized.

Further, entire rate conversion corresponding to integer times and rational number times is available, and both functions of an interpolation filter and a decimation filter can be performed.

An exemplary embodiment of the present invention may not only be embodied through the above-described apparatus and/or method, but may also be embodied through a program that executes a function corresponding to a configuration of the exemplary embodiment of the present invention or through a recording medium on which the program is recorded, and can be easily embodied by a person of ordinary skill in the art from a description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A device that converts a rate of input data, the device comprising:
a rate counter that calculates a rate representing a ratio of frequencies of an input clock and an output clock, wherein the rate counter comprises:
an output clock counter that performs a counting operation based on the output clock according to a first enable signal;
a counter enable generator that generates a second enable signal using a counting value of the output clock counter and that generates a third enable signal by delaying the second enable signal based on the input clock; and
an input clock counter that generates the rate by performing the counting operation based on the input clock according to the first enable signal and the second enable signal;
a phase accumulator that generates a first parameter representing a memory address position to sample using the rate and a second parameter representing a phase value of an estimation time point;
an asynchronous data sampler that records data that is input based on an input clock and that outputs continued data using the first parameter based on an output clock;
a filter coefficient operation unit that calculates a plurality of first operation values using the continued data and a plurality of filter coefficients; and a phase operation unit that generates and outputs final data using the plurality of first operation values and the second parameter.

2. The device of claim 1, wherein the phase accumulator comprises:
a rate enable generator that generates a fifth enable signal based on the output clock using a fourth enable signal;
a rate accumulator that accumulates the rate based on the output clock according to the fourth enable signal and the fifth enable signal; and
a bit selection unit that uses some bits of a cumulative value of the rate as the first parameter and that uses some other bits of a cumulative value of the rate as the second parameter.

3. The device of claim 1, wherein the asynchronous data sampler comprises:
a shift register that delays and outputs the input data based on the input clock according to the third enable signal;
a write address generator that generates a write address according to the third enable signal;
an enable controller that generates the fourth enable signal and a sixth enable signal by delaying the third enable signal based on the input clock and the output clock;
a read address generator that generates a plurality of read addresses for reading the continued data based on the output clock using the first parameter; and
a memory that records data that is output from the shift register according to the write address.

4. The device of claim 3, wherein the asynchronous data sampler further comprises a D flip-flop that delays the continued data that is output from the memory according to the plurality of read addresses based on the output clock, and outputs the delayed data to the filter coefficient operation unit, according to the sixth enable signal.

5. The device of claim 4, wherein the enable controller comprises a plurality of D flip-flops that are coupled in series,
some D flip-flops that are positioned at the front of the plurality of D flip-flops operate based on the input clock,
the remaining D flip-flops of the plurality of D flip-flops operate based on the output clock, and
a sixth enable signal is generated from an output value of a final D flip-flop of the plurality of D flip-flops.

6. The device of claim 5, wherein the fourth enable signal is generated from an output value of an immediately preceding D flip-flop of the final D flip-flop of the plurality of D flip-flops.

7. The device of claim 3, wherein the read address generator generates a first read address based on the output clock using the first parameter, and generates the remaining read addresses by adding respective values from 1 to a value corresponding to a degree to obtain to the first read address based on the first read address.

8. The device of claim 3, wherein the write address generator comprises:
a multiplexer that selects and outputs a value that accumulates 1 to an immediately preceding write address according to the third enable signal; and
a D flip-flop that generates the write address by delaying an output value of the multiplexer based on the input clock.

9. The device of claim 3, wherein the shift register comprises a plurality of sub-delay units that are sequentially connected,
wherein the plurality of sub-delay units each comprise:
a multiplexer that selects and outputs the input data according to the third enable signal; and
a D flip-flop that delays and outputs an output of the multiplexer based on the input clock,
wherein an output of a D flip-flop of one sub-delay unit is input to a multiplexer of a sub-delay unit that is positioned after the one sub-delay unit.

10. The device of claim 1, wherein the filter coefficient operation unit comprises a plurality of sub-operation units that calculate each of the plurality of first operation values,
the plurality of sub-operation units multiply a plurality of filter coefficients, respectively, by the continued data, and calculate the first operation value by adding multiplied values, and
the number of sub-operation units is determined according to a degree of the data rate conversion device.

11. The device of claim 1, wherein the phase operation unit comprises:
a plurality of multipliers; and
a plurality of adders that add and output a plurality of first operation values to an output value of the plurality of multipliers, respectively,
wherein each of the plurality of multipliers multiplies and outputs an output value of a corresponding adder of the plurality of adders and the second parameter, and
final data is generated from an output value of one adder of the plurality of adders.

12. A method in which a data rate conversion device converts a rate of input data, the method comprising:
calculating a rate representing a ratio of frequencies of an input clock and an output clock, wherein the calculating of the rate comprises:
counting based on the output clock according to a first enable signal;
generating a second enable signal using the counting value;
generating a third enable signal by delaying the second enable signal based on the input clock; and
calculating the rate by counting based on the input clock according to the first enable signal and the second enable signal;
generating a first parameter representing a memory address position to sample according to the rate and a second parameter representing a phase value of an estimation time point;
recording input data based on the input clock at a memory;
outputting continued data from the memory using the first parameter based on the output clock; and
outputting final data using the continued data, a plurality of filter coefficients, and the second parameter.

13. The method of claim 12, wherein the recording of input data comprises generating a write address by accumulating 1 to an immediately preceding write address based on the input clock according to a third enable signal, and
the bit number of the write address is determined according to an address length of the memory.

14. The method of claim 13, further comprising:
before the recording of input data,
counting based on the output clock according to the first enable signal;
generating a second enable signal according to a comparison result of the counting value and a threshold value; and
generating a third enable signal by delaying the second enable signal based on the input clock.

15. The method of claim 13, wherein the outputting of continued data comprises:
generating a sixth enable signal by delaying the third enable signal based on the input clock and the output clock; and generating a plurality of read addresses for reading the continued data based on the first parameter and the output clock according to the sixth enable signal.

16. The method of claim 13, wherein the generating of a first parameter comprises:
generating a fourth enable signal by delaying the third enable signal based on the input clock and the output clock;
generating a fifth enable signal based on the output clock;
accumulating the rate based on the output clock according to the fourth enable signal and the fifth enable signal; and
setting some bits of a cumulative value of the rate to the first parameter and setting other some bits of a cumulative value of the rate to the second parameter.

17. The method of claim 16, wherein the outputting of continued data comprises determining a read time point of the continued data according to a sixth enable signal that delays the fourth enable signal based on the output clock.

18. The method of claim 12, wherein the outputting of final data comprises:
calculating a plurality of first operation values using the continued data and a plurality of filter coefficients; and
generating final data by applying the second parameter to each of the plurality of first operation values.

* * * * *